United States Patent [19]
Coldren et al.

[11] Patent Number: 5,877,038
[45] Date of Patent: Mar. 2, 1999

[54] METHOD OF MAKING A VERTICAL CAVITY LASER

[75] Inventors: Larry A. Coldren, Santa Barbara; Steven P. DenBaars, Goleta, both of Calif.

[73] Assignee: The Regents of the University of California, Oakland, Calif.

[21] Appl. No.: 758,241

[22] Filed: Nov. 27, 1996

[51] Int. Cl.⁶ .................................................. H01L 21/00
[52] U.S. Cl. ............................................................ 438/39
[58] Field of Search .................................. 438/32, 39, 40, 438/41

[56] References Cited

U.S. PATENT DOCUMENTS

| | | | |
|---|---|---|---|
| 5,045,499 | 9/1991 | Nishizawa et al. ........................ | 438/32 |
| 5,082,799 | 1/1992 | Holmstrom et al. ....................... | 438/39 |
| 5,293,392 | 3/1994 | Shieh et al. ............................... | 372/96 |
| 5,358,880 | 10/1994 | Lebby et al. ............................. | 437/23 |
| 5,416,044 | 5/1995 | Chino et al. .............................. | 438/39 |
| 5,568,504 | 10/1996 | Köck et al. ............................... | 372/96 |

*Primary Examiner*—Brian Dutton
*Attorney, Agent, or Firm*—Merchant, Gould, Smith, Edell, Welter & Schmidt

[57] ABSTRACT

A highly controllable, compact method for making a vertical cavity laser. By using selective etching and contact layers within the laser cavity, higher efficiencies and lower power requirements for vertical cavity surface emitting lasers (VCSELs) are achieved.

32 Claims, 9 Drawing Sheets

METHOD OF MAKING A VERTICAL CAVITY LASER

CROSS-REFERENCE TO RELATED APPLICATION

This application is related to an application entitled "Blue Light Laser" filed on Sep. 4, 1996, Ser. No. 08/707,800, which related application is incorporated by reference herein.

BACKGROUND OF THE INVENTION

1. Field of the Invention

This invention relates in general to a vertical cavity surface emitting laser (VCSEL). More particularly, the invention concerns a VCSEL that uses electrical contact layers integrated into the laser cavity of the device.

2. Description of Related Art

There are many applications of lasers which require emission at wavelengths which are traditionally difficult to achieve, particularly the green and blue regions. The applications which call for wavelengths in these regions fall mostly into two broad categories, those that require coverage over the visible spectrum and those which are resolution-driven. Applications which call for coverage over the visible spectrum include display technologies, including projection displays and visual screens, such as television screens. Applications which are resolution-driven take advantage of increased spatial resolution afforded by shorter wavelengths. For example, optical data storage media, such as compact discs and laser discs require a focused laser beam to read the data off the disc. If shorter wavelengths are used, then data storage densities can be increased.

Various approaches to fabricating blue lasers, including gas lasers, and frequency-shifted solid state lasers have been attempted. However, it is a commonly held opinion that blue laser sources will only enjoy widespread use if they can be made inexpensively, for example using semiconductor fabrication techniques, and be made to operate reliably.

In recent years, the vertical-cavity semiconductor laser (VCL) has emerged as a new coherent light source alongside the conventional in-plane semiconductor laser. Advantages of the VCL include its compactness, inherent single-longitudinal mode operation, circular beam profile and straightforward integration with other electronic circuitry. Vertical-cavity lasers hold promise of superior performance in many optoelectronic applications and lower manufacturing cost than in-plane lasers.

State of the art GaAs-based vertical-cavity lasers operate continuously at room temperature with sub-100 $\mu$A threshold currents. The outstanding performance of these lasers is partly due to their monolithic fabrication process and the quality of Al(Ga)As/GaAs quarter-wave mirrors, which are presently the highest quality epitaxial mirrors that can be routinely fabricated.

It is therefore desirable to combine the advantages of VCL lasers with new semiconductor materials to produce blue and green semiconductor lasers.

Semiconductor diode lasers operating in the infrared have been very successful and attempts have been made to produce lasers operating in the blue and green regions of the spectrum from semiconductor materials. Attempts have been made using II–VI semiconductor compounds, such as zinc sulfide. However, II–VI-based semiconductor lasers manifest severe problems with reliability and lifetime.

An alternate approach using the group III nitrides has emerged as the most promising approach for generating green, blue, and even ultraviolet light. There are, however, certain difficulties with this approach also, including the formation of doped regions to form a diode junction.

Therefore, there is a need for blue and green semiconductor lasers which can be fabricated inexpensively and reliably, which demonstrate good beam qualities, and which avoid the problems of doping the III-N semiconductor compounds to form diode junctions.

SUMMARY OF THE INVENTION

To minimize the limitations in the prior art described above, and to minimize other limitations that will become apparent upon reading and understanding the present specification, the present invention discloses a powerful and highly productive method for creating vertical cavity lasers. The present invention is comprehensive and is fully integrated with present fabrication techniques.

The present invention solves the above-described problems by providing a method of manufacturing a VCSEL that has contact regions within the laser cavity of the VCSEL.

A VCSEL in accordance with the principles of the present invention comprises at least one contact within the laser cavity, where the contact is transparent at the VCSEL output frequency.

One object of the present invention is to make the VCSEL have a lower operating voltage and be more efficient. Another object of the present invention is to create a new method and structure for the VCSEL.

An advantage of the present invention is to provide a lower series voltage across a VCSEL, because the potential barriers in the mirrors are circumvented, resulting in less power dissipation and heating in the laser, and a concomitant increase in efficiency. Another advantage of the present invention is to provide a VCSEL structure which provides good current confinement and low optical loss.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there is illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides a method and product that is more efficient than current VCSELs. The efficiency is raised by having contacts within the laser cavity that are close to the active layer of the device, thus reducing the series voltage across the VCSEL due to resistance of the p-layer or the p-Distributed Bragg Reflector (DBR) mirrors, or other electric fields in the device. The efficiency is also enhanced in the present invention via good current confinement and optical waveguiding.

The contacts lie between the mirrors of the VCSEL. This allows the contacts to be either within the laser cavity, or at least, close to the active layer, eliminating the distances that electrons and holes must travel in order to recombine in the active region to produce laser light.

Figure 1A:
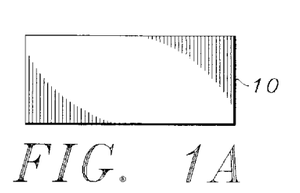
FIGS. 1A–1K are block diagrams of the VCSEL produced by a method of the present invention.
Figure 1B:
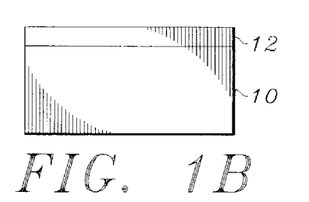

FIGS. 1A–1K illustrate stages of producing the VCSEL by a method of the present invention. FIG. 1A shows a substrate 10. The substrate 10 may be sapphire, but can also be gallium arsenide, silicon carbide, gallium nitride, aluminum gallium nitride, silicon, or other materials. FIG. 1B shows an inhibitor layer 12 grown on substrate 10. Inhibitor layer 12 is typically silicon dioxide, but can be other materials. Inhibitor layer 12 is optional for the construction of the device.

Figure 1C:
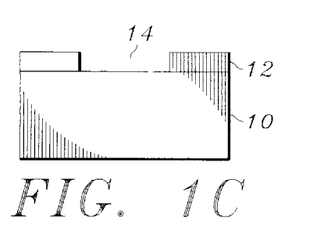

FIG. 1C shows aperture 14 etched in inhibitor layer 12. The aperture 14 exposes a portion of substrate 10, while other portions of substrate 10 are still covered with inhibitor layer 12.

Figure 1D:
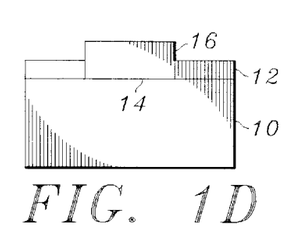

FIG. 1D shows mirror 16 grown within aperture 14 on substrate 10. The inhibitor layer 12 prevents mirror 16 from growing on substrate 10 where substrate 10 is covered by inhibitor layer 12. Further, inhibitor layer 12 and mirror 16 do not adhere to each other, and therefore, mirror 16 does not grow on inhibitor layer 12. Mirror 16 is typically a distributed Bragg reflector (DBR), and is typically comprised of a quarter wave stack of gallium nitride and aluminum nitride, but can be comprised of other materials, such as aluminum gallium arsenide/aluminum gallium indium phosphide (AlGaAs/AlGaInP), aluminum gallium arsenide/aluminum oxide (AlGaAs/Al$_2$O$_3$), insulating titanium dioxide/silicon oxide (TiO$_2$/SiO$_2$), magnesium fluoride/zinc sulfide (MgF/ZnS), calcium fluoride/zinc sulfide (CaF/ZnS), conductive indium tin oxide/zinc oxide (ITO/ZnO), or other materials. Further, a metal backing layer can be used on the mirror 16 to reduce the mirror 16 thickness and increase the mirror 16 reflectivity.

Figure 1E:
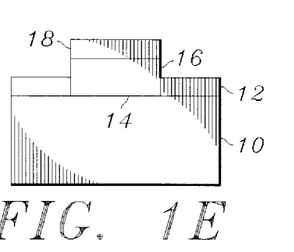

FIG. 1E shows contact layer 18 grown on mirror 16. Contact layer 18 and inhibitor layer 12 do not adhere to each other, thus, contact layer 18 does not grow on inhibitor layer 12. Contact layer 18 is typically an n+ doped gallium nitride layer, but can be other materials. Contact layer 18 should be substantially transparent at the VCSEL frequency of interest.

Figure 1F:
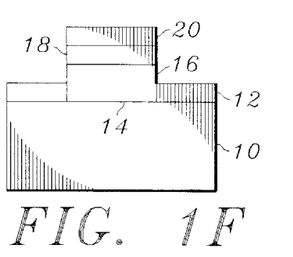

FIG. 1F shows active layer 20 grown on contact layer 18. Active layer 20 is typically indium gallium nitride, but can be other materials.

Figure 1G:
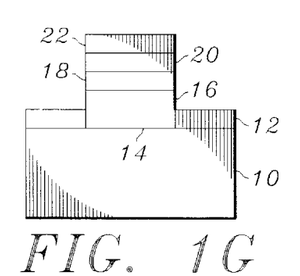

FIG. 1G shows second contact layer 22 grown on active layer 20. Second contact layer 22 is typically a p+ doped gallium nitride layer, but can be other materials. Second contact layer 22 should be substantially transparent at the VCSEL frequency of interest.

Figure 1H:
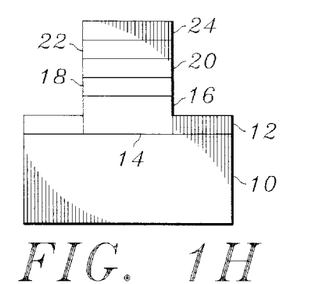

FIG 1H shows second mirror 24 grown on second contact layer 22. Second mirror 24 is typically a distributed Bragg reflector (DBR), which consists of alternating layers of gallium nitride and aluminum nitride, but can be other materials.

Figure 1I:
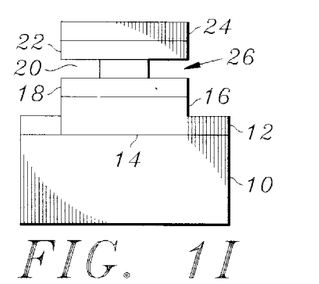

FIG. 1I shows active layer 20 etched laterally by process 26. The etch process 26 is typically a selective etch. The etch process 26 is typically photoelectrochemical (PEC) lateral underetching, but can be other methods of etching. PEC etching is particularly suited for the VCSEL application because of PEC's bandgap dependent etch selectivity. The etching process 26 is done to aperture the current and the optical mode to the desired device area, typically approximately 5 $\mu$m in diameter, but can be wider or narrower as desired. The etch process 26 is typically a bandgap selective PEC-etching technique, but can be other etch techniques as desired.

Figures 1J, 1K:
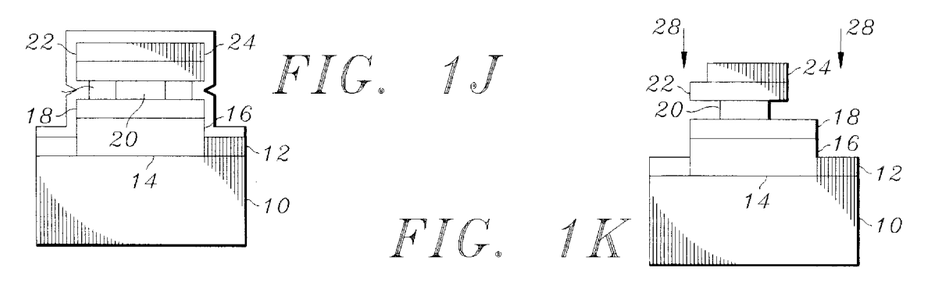

FIG. 1J shows the addition of masking layer 15. Masking layer 15 performs the function of partially or totally filling the volume left by the lateral underetching of layer 20, as well as providing masking material for subsequent etches. Masking layer 15 is typically SiO$_2$ or SiN, but can be other materials.

FIG. 1K shows second etch 28 etching vertically on second mirror 24 and second contact layer 22. The second etch 28 can involve the use of masking layer 15. The second etch 28 removes portions of second mirror 24 and second contact layer 22 to expose an area of contact layer 18. Further, second etch 28 further etches another portion of second mirror 24 to expose second contact layer 22. The second etch 28 allows access to contact layer 18 and second contact layer 22 for electrical connections. The connections allow current to be pumped into the active layer 20 from contact layer 18 and second contact layer 22 from an external power source.

Figure 2A:
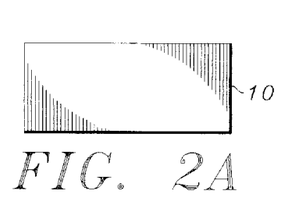
FIGS. 2A–2M are block diagrams of the VCSEL produced by an alternative method of the present invention.
Figure 2B:
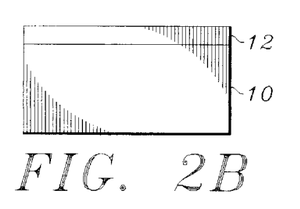

FIGS. 2A–2M are block diagrams of the VCSEL produced by an alternative method of the present invention. FIG. 2A shows a substrate 10. The substrate 10 may be sapphire, but can also be gallium arsenide, or other materials. FIG. 2B shows an inhibitor layer 12 grown on substrate 10. Inhibitor layer 12 is typically silicon dioxide, but can be other materials.

Figure 2C:
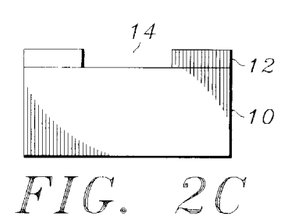

FIG. 2C shows aperture 14 etched in inhibitor layer 12. The aperture 14 exposes a portion of substrate 10, while other portions of substrate 10 are still covered with inhibitor layer 12.

Figure 2D:
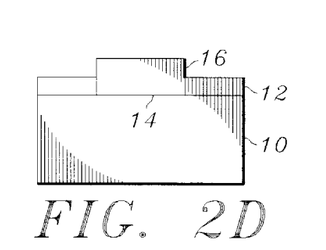

FIG. 2D shows mirror 16 grown within aperture 14 on substrate 10. The inhibitor layer 12 prevents mirror 16 from growing on substrate 10 where substrate 10 is covered by inhibitor layer 12. Further, inhibitor layer 12 and mirror 16 do not adhere to each other, and therefore, mirror 16 does not grow on inhibitor layer 12. Mirror 16 is typically a distributed Bragg reflector (DBR), and is typically comprised of a quarter wave stack of gallium nitride and aluminum nitride, but can be comprised of other materials.

Figure 2E:
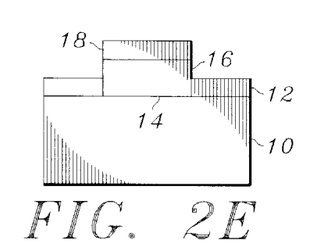

FIG. 2E shows contact layer 18 grown on mirror 16. Contact layer 18 and inhibitor layer 12 do not adhere to each other, thus, contact layer 18 does not grow on inhibitor layer 12. Contact layer 18 is typically an n+ doped gallium nitride layer, but can be other materials. Contact layer 18 should be substantially transparent at the VCSEL frequency of interest.

Figure 2F:
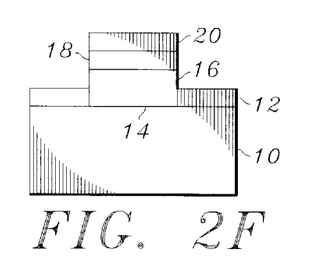

FIG. 2F shows active layer 20 grown on contact layer 18. Active layer 20 is typically indium gallium nitride, but can be other materials, such as indium gallium arsenide nitride (InGaAsN), indium gallium arsenide phosphide (InGaAsP), or indium gallium arsenide (InGaAs).

Figure 2G:
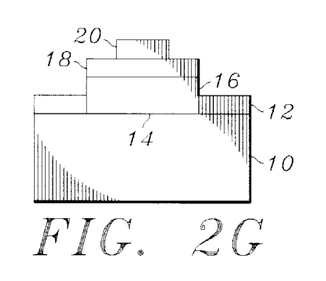

FIG. 2G shows active layer 20 being etched to a width narrower than that of contact layer 18.

Figure 2H:
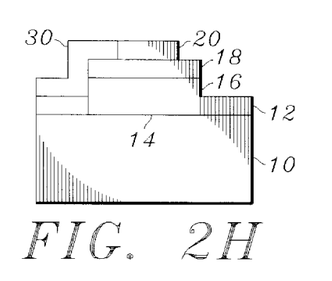

FIG. 2H shows second inhibitor layer 30 grown on a portion of contact layer 18 and on a proximate portion of inhibitor layer 12. The second inhibitor layer 30 abuts and is adjacent to active layer 20. Second inhibitor layer 30 is typically silicon dioxide, but can be other materials.

Figure 2I:
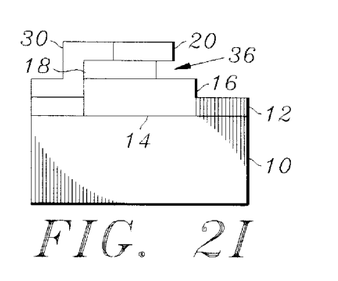

FIG. 2I shows contact layer 18 being etched by etch process 32. The etch process 32 is typically a selective etch, which undercuts the active layer 20. The etch process 32 is typically photoelectrochemical (PEC) lateral underetching, but can be other methods of etching.

Figure 2J:
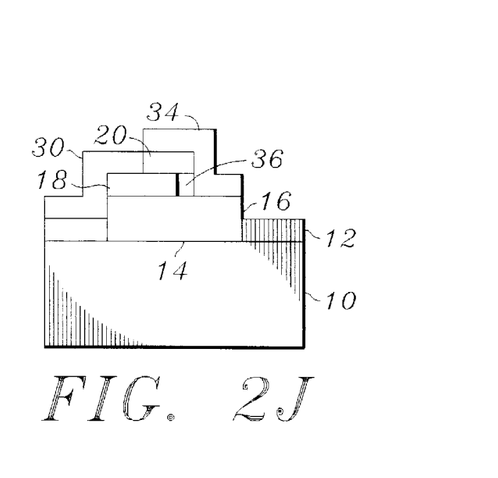

FIG. 2J shows second contact layer 34 grown on a portion of mirror 16 and over active layer 20. A gap 36 is left between contact layer 18 and second contact layer 34 to prevent shorting contact layer 18 and second contact layer 34 together. Second contact layer 34 is typically p+ doped gallium nitride, but can be other materials. Second contact layer 34 should be substantially transparent at the VCSEL frequency of interest.

Figure 2K:
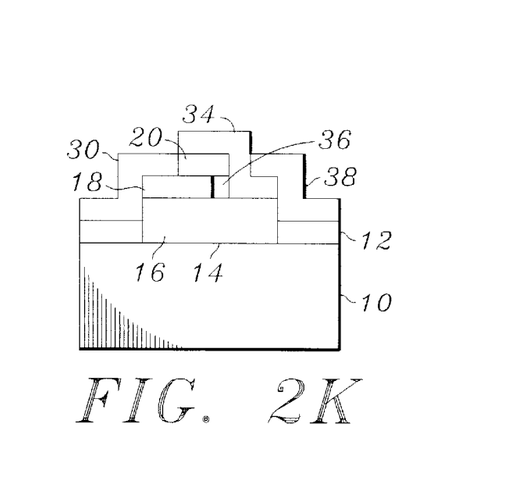

FIG. 2K shows third inhibitor layer 38 grown on first inhibitor layer 12 and the proximate portion of second contact layer 34. Third inhibitor layer 38 is typically silicon dioxide, but can be other materials.

Figure 2L:
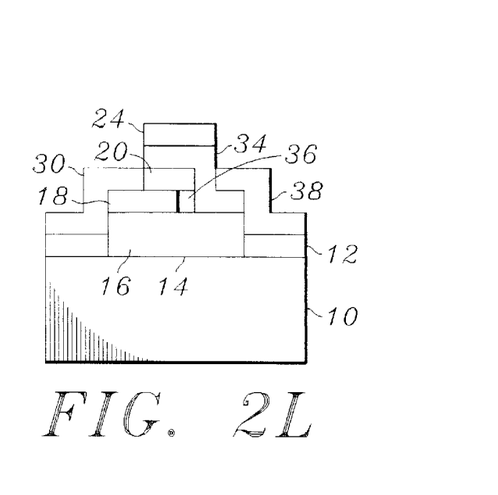

FIG. 2L shows second mirror 24 grown on the exposed portion of second contact layer 34. Second mirror 24 is typically a gallium nitride and aluminum nitride quarter wave stack, but can be other materials.

Figure 2M:
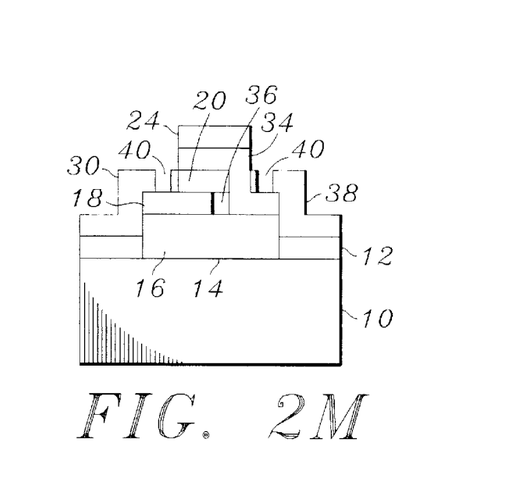

FIG. 2M shows openings 40 etched into second inhibitor layer 30 and third inhibitor layer 38. The openings 40 expose contact layer 18 and second contact layer 34 such that contacts are places within openings 40 to allow external voltages to be placed on contact layer 18 and second contact layer 34 which will cause active layer 20 to recombine and begin lasing.

Figure 3A:
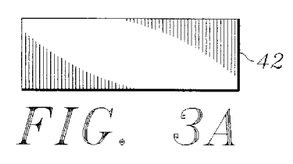
FIGS. 3A–3L are block diagrams of the VCSEL produced by an alternative method of the present invention.
Figure 3B:
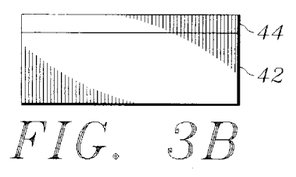

FIGS. 3A–3L are block diagrams of the VCSEL produced by an alternative method of the present invention. FIG. 3A shows a second substrate 42. The second substrate 42 may be sapphire, but can also be gallium arsenide, or other materials. FIG. 3B shows a liftoff layer 44 grown on second substrate 42. Liftoff layer 44 is typically zinc oxide, but can be other materials, such as lanthanum gallium oxide (LaGaO), silicon, gallium arsenide (GaAs), or indium gallium nitride ($In_xGa_yN$, where x>0.2).

Figure 3C:
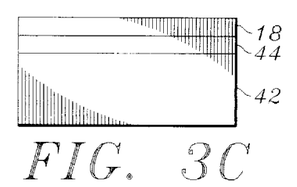

FIG. 3C shows contact layer 18 grown on liftoff layer 44. Contact layer 18 is typically an n+ doped gallium nitride layer, but can be other materials. Contact layer 18 should be substantially transparent at the VCSEL frequency of interest.

Figure 3D:
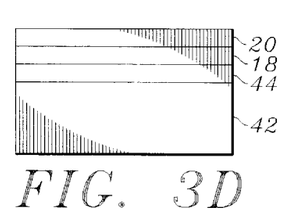

FIG. 3D shows active layer 20 grown on contact layer 18. Active layer 20 is typically indium gallium nitride, but can be other materials.

Figure 3E:
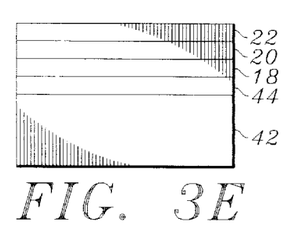

FIG. 3E shows second contact layer 22 grown on active layer 20. Second contact layer 22 is typically a p+ doped gallium nitride layer, but can be other materials. Second contact layer 22 should be substantially transparent at the VCSEL frequency of interest.

Figure 3F:
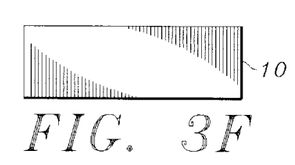

FIG. 3F shows substrate 10. Substrate 10 is typically gallium arsenide, but can be other materials.

Figure 3G:
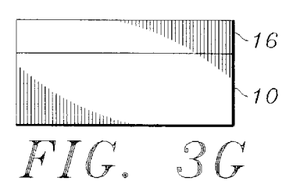

FIG. 3G shows first mirror 16 grown on substrate 10. First mirror 16 is typically a quarter wave stack, comprised of alternating layers of aluminum gallium arsenide and oxidized aluminum arsenide, but can be other materials.

Figure 3H:
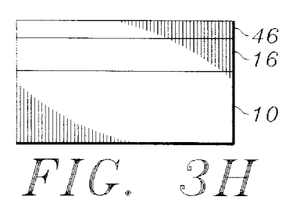

FIG. 3H shows dummy contact layer 46 grown on first mirror 16. Dummy contact layer 46 can be a p+ doped aluminum gallium arsenide layer, a stack of a p+ doped aluminum gallium arsenide layer, a partially oxidized p+ aluminum gallium arsenide layer, and a second p+ doped aluminum gallium arsenide layer, or other arrangement of layers within the dummy contact layer 46. Dummy contact layer 46 is an optional layer which may be included to facilitate the bonding, but is not necessary in general.

Figure 3I:
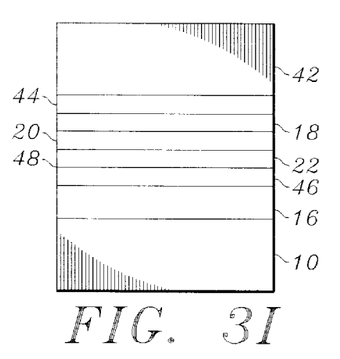

FIG. 3I shows dummy contact layer 46 coupled to second contact layer 22 at junction 48. Junction 48 can be a fusion junction, a bonding junction, or other type of junction that allows electron flow across junction 48. The bonding agent can be epoxy, or other common optical cement transparent to the laser light.

Figure 3J:
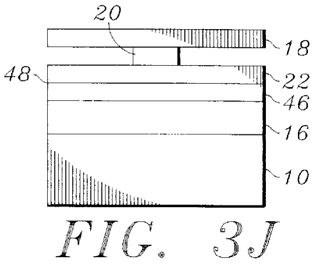

FIG. 3J shows removal of second substrate 42 and liftoff layer 44 from contact layer 18, thus exposing contact layer 18. Further, active layer 20 is selectively etched to provide the desired current and optical aperturing.

Figure 3K:
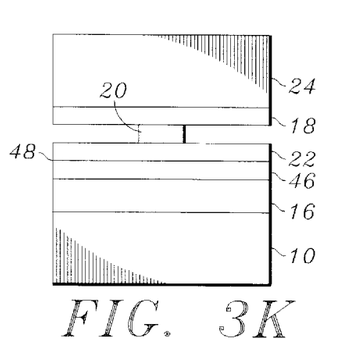

FIG. 3K shows growing second mirror 24 on top of the exposed contact layer 18. Second mirror 24 is typically a quarter wave stack of alternating layers of titanium oxide and silicon dioxide, but can be comprised of other materials, such as aluminum gallium arsenide/aluminum gallium indium phosphide (AlGaAs/AlGaInP), aluminum gallium arsenide/aluminum oxide ($AlGaAs/Al_2O_3$), insulating titanium dioxide/silicon oxide ($TiO_2/SiO_2$), magnesium fluoride/zinc sulfide (MgF/ZnS), calcium fluoride/zinc sulfide (CdF/ZnS), conductive indium tin oxide/zinc oxide (ITO/ZnO), or other materials. Further, a metal backing layer can be used on the mirror 16 to reduce the mirror 16 thickness and increase the mirror 16 reflectivity.

Figure 3L:
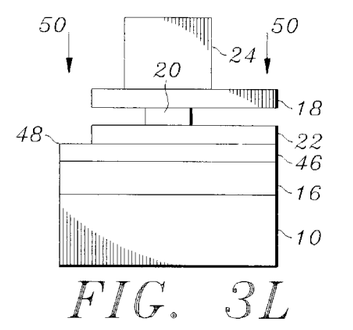

FIG. 3L shows second mirror 24, contact layer 18, active layer 20, and second contact layer 22 etched away by etch process 50. If dummy contact layer 46 is not included, etch process 50 does not etch through second contact layer 22. The etch process 50 is typically a selective etch. The etch process 50 is typically photoelectrochemical (PEC) lateral underetching, but can be other methods of etching. The etch process 50 is typically a bandgap selective PEC-etching technique, but can be other etch techniques as desired.

Figure 4:
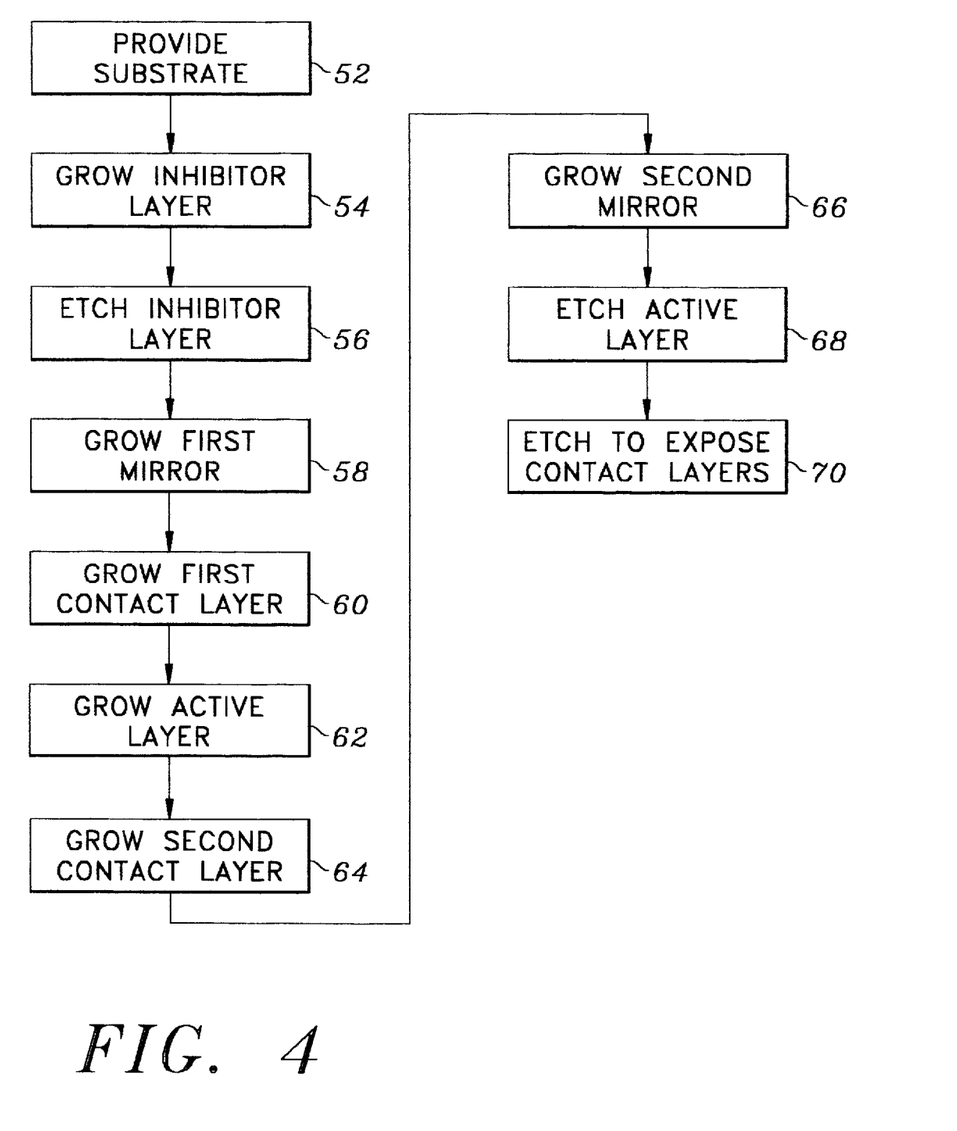
FIG. 4 is a flow chart showing the steps of the method of the present invention.

FIG. 4 is a flow chart showing the steps of the method of the present invention. Block 52 shows the step of providing a substrate. Block 54 shows the step of growing an inhibitor layer. Block 56 shows the step of etching the inhibitor layer. Block 58 shows the step of growing the first mirror. Block 60 shows the step of growing the first contact layer. Block 62 shows the step of growing the active layer. Block 64 shows the step of growing the second contact layer. Block 66 shows the step of growing the second mirror. Block 68 shows the step of etching the active layer. Block 70 shows the step of etching to expose the contact layers.

Figure 5:
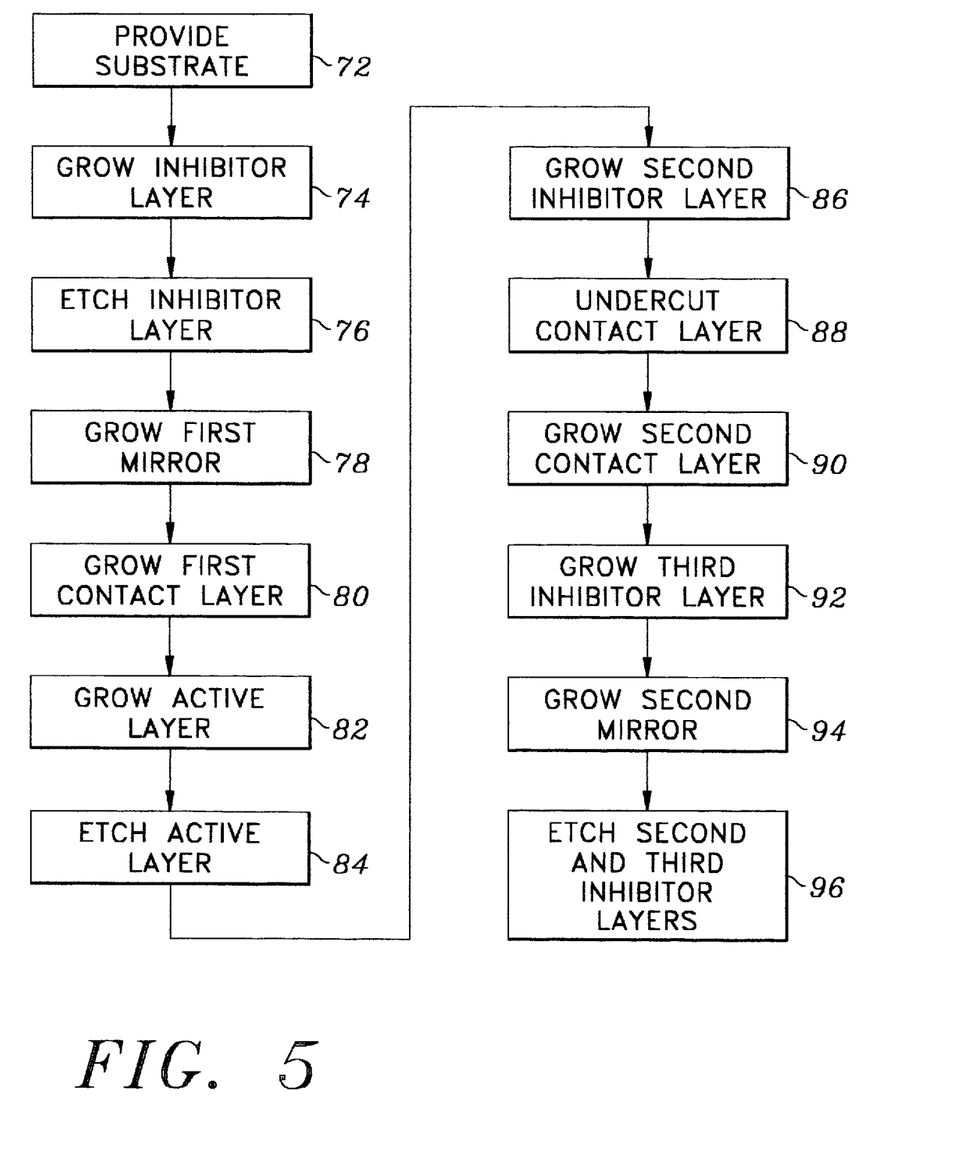
FIG. 5 is a flow chart showing the steps of an alternative method of the present invention.

FIG. 5 is a flow chart showing the steps of an alternative method of the present invention. Block 72 shows the step of providing a substrate. Block 74 shows the step of growing an inhibitor layer. Block 76 shows the step of etching the inhibitor layer. Block 78 shows the step of growing the first mirror. Block 80 shows the step of growing the first contact layer. Block 82 shows the step of growing the active layer. Block 84 shows the step of etching the active layer. Block 86 shows the step of growing the second inhibitor layer. Block 88 shows the step of undercutting the contact layer. Block 90 shows the step of growing the second contact layer. Block 92 shows the step of growing the third inhibitor layer. Block 94 shows the step of growing the second mirror. Block 96 shows the step of etching the second and third inhibitor layers to expose the contact layers.

Figure 6:
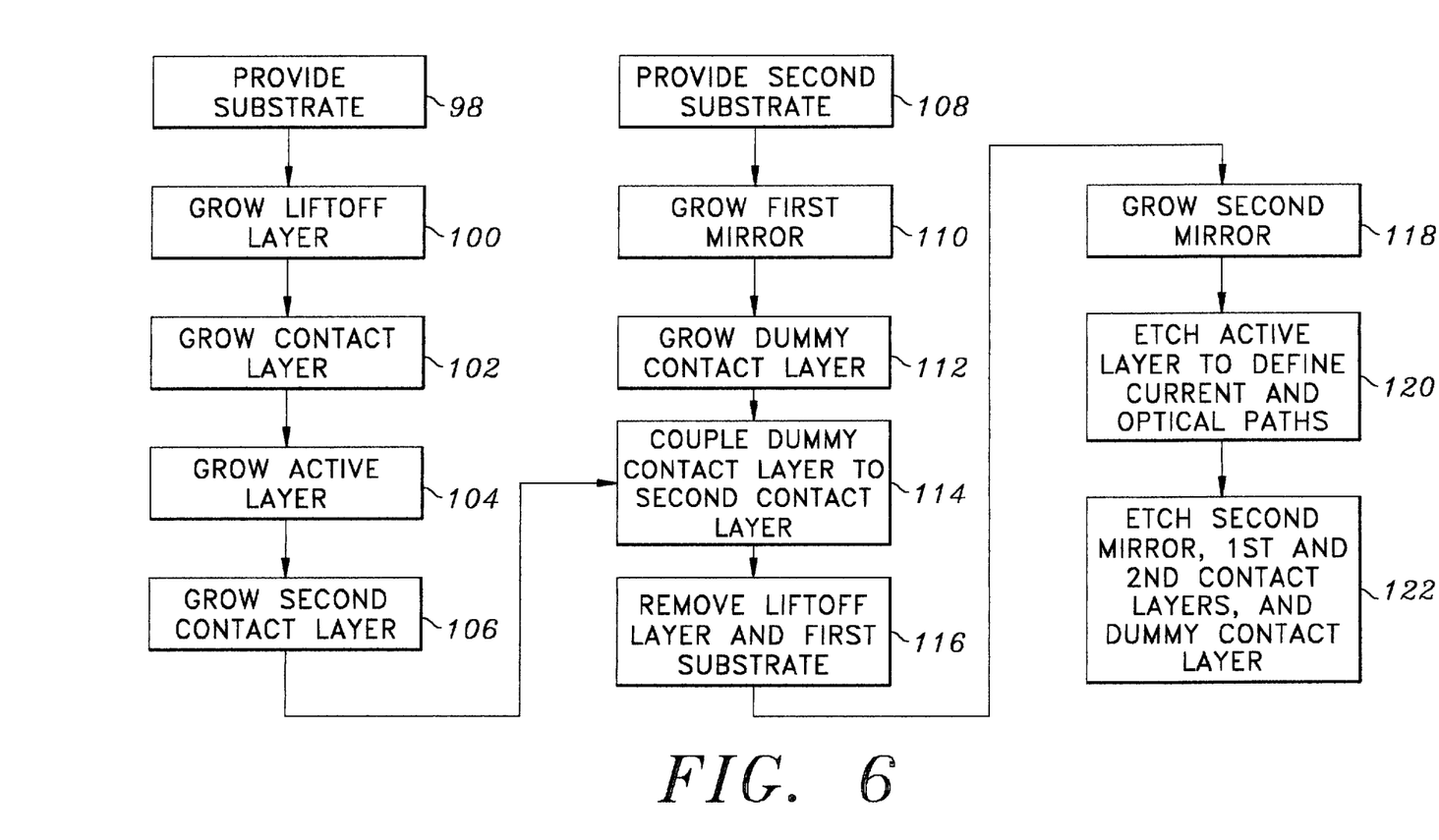
FIG. 6 is a flow chart showing the steps of another alternative method of the present invention.

FIG. 6 is a flow chart showing the steps of another alternative method of the present invention. Block 98 shows the step of providing a substrate. Block 100 shows the step of growing a liftoff layer. Block 102 shows the step of growing the first contact layer. Block 104 shows the step of growing the active layer. Block 106 shows the step of growing the second contact layer. Block 108 shows the step of providing a second substrate. Block 110 shows the step of growing a first mirror. Block 112 shows the step of growing the dummy contact layer. Block 114 shows the step of coupling the dummy contact layer to the second contact layer. Block 116 shows the step of removing the liftoff layer and first substrate. Block 118 shows the step of growing the second mirror. Block 120 shows the step of etching the active layer to define the current and optical paths. Block 122 shows the step of etching the second mirror, first and second contact layers, and the dummy contact layer.

Figure 7A:
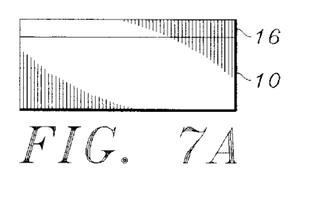
FIGS. 7A–7H illustrate stages of producing the VCSEL by another method of the present invention.

FIGS. 7A–7H illustrate stages of producing the VCSEL by another method of the present invention. FIG. 7A shows a lower mirror 16 grown a substrate 10. The substrate 10 may be sapphire, but may also be gallium arsenide, or other materials. Mirror 16 is typically a distributed Bragg reflector (DBR), having a stack of alternating quarter wave layers of gallium nitride and aluminum gallium nitride, but may be comprised of other materials. The lower mirror 16 is typically formed to have a high reflectivity at the wavelength emitted by the VCSEL.

Figure 7B:
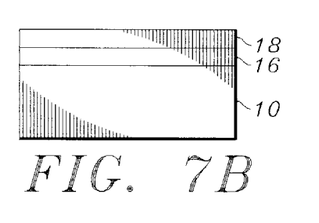

FIG. 7B shows a first contact layer 18 grown on mirror 16. First contact layer 18 is typically an n+ doped gallium nitride layer, but can be other materials. Contact layer 18 should be substantially transparent at the wavelength of light emitted by the VCSEL.

Figure 7C:
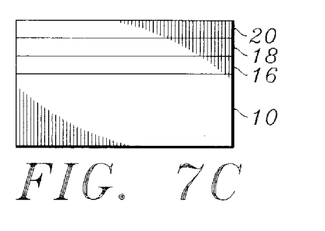

FIG. 7C shows an active layer 20 grown on the first contact layer 18. Active layer 20 is typically indium gallium nitride, but may be other materials, including a multiple quantum well indium gallium nitride structure having alternating layers of nitride with different indium fractions.

Figure 7D:
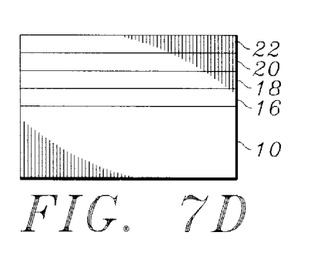

FIG. 7D shows a second contact layer 22 grown on the active layer 20. The second contact layer 22 is typically a p+ doped gallium nitride layer, but can be other materials. Second contact layer 22 should be substantially transparent at the wavelength of light emitted by the VCSEL.

Figure 7E:
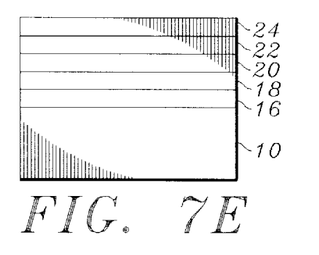

FIG. 7E shows an output mirror 24 grown on the second contact layer 22. The output mirror 24 is typically a distributed Bragg reflector (DBR) formed from alternating layers of gallium nitride and aluminum gallium nitride, but can be other materials, such as a dielectric stack made of alternating layers of gallium nitride and aluminum nitride, but can be comprised of other materials, such as aluminum gallium arsenide/aluminum gallium indium phosphide (AlGaAs/AlGaInP), aluminum gallium arsenide/aluminum oxide (AlGaAs/Al$_2$O$_3$), insulating titanium dioxide/silicon oxide (TiO$_2$/SiO$_2$), magnesium fluoride/zinc sulfide (MgF/ZnS), calcium fluoride/zinc sulfide (CaF/ZnS), conductive indium tin oxide/zinc oxide (ITO/ZnO), or other materials.

The output mirror 24 can also be deposited through a mask which results in the desired width of output mirror 24.

Figure 7F:
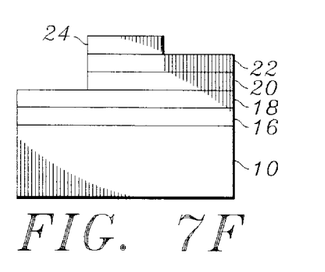

FIG. 7F shows the active layer 20, the second contact layer 22, and the output mirror 24 etched vertically. In addition, part of the output mirror 24 lying above the second contact layer 22 is etched. If output mirror 24 was deposited through a mask, the etch of the output mirror 24 is unnecessary.

Figure 7G:
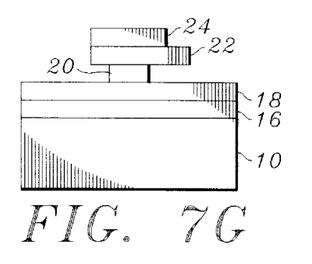

FIG. 7G shows that the second contact layer 22 is etched so as to leave a portion of the second contact layer protruding from under the output mirror.

Figure 7H:
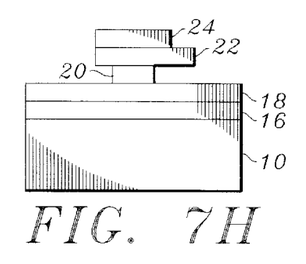

FIG. 7H shows that the active layer 20 has been laterally etched using a selective etch process, such as photoelectrochemical etching. The lateral etching process is performed to aperture the current to the desired device area, typically approximately 5 µm in diameter, but can be wider or narrower as desired. Further, the lateral etching acts as a lens to focus the light to reduce optical cavity losses.

Figure 8A:
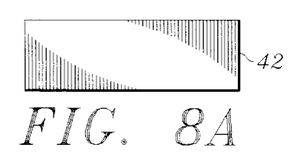
FIGS. 8A–8K illustrate another method for producing the VCSEL of the present invention.
Figure 8B:
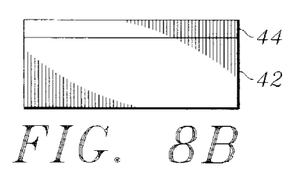

FIGS. 8A–8K illustrate another method for producing the VCSEL of the present invention. FIG. 8A shows a second substrate 42. The second substrate 42 may be sapphire, silicon, or silicon carbide, but can also be gallium arsenide, or other materials. FIG. 8B shows a liftoff layer 44 grown on second substrate 42. Liftoff layer 44 is typically zinc oxide, but can be other materials, such as lanthanum gallium oxide (LaGaO), silicon, gallium arsenide (GaAs), or indium gallium nitride (In$_x$Ga$_y$N, where x>0.2).

Figure 8C:
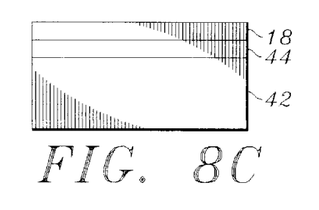

FIG. 8C shows contact layer 18 grown on liftoff layer 44. Contact layer 18 is typically an n+ doped gallium nitride layer, but can be other materials. Contact layer 18 should be substantially transparent at the VCSEL frequency of interest.

Figure 8D:
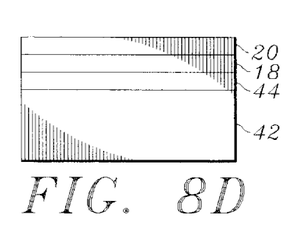

FIG. 8D shows active layer 20 grown on contact layer 18. Active layer 20 is typically indium gallium nitride, but can be other materials.

Figure 8E:
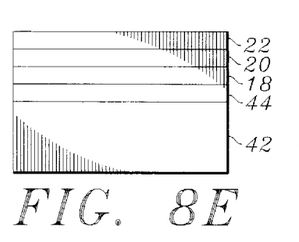

FIG. 8E shows second contact layer 22 grown on active layer 20. Second contact layer 22 is typically a p+ doped gallium nitride layer, but can be other materials. Second contact layer 22 should be substantially transparent at the VCSEL frequency of interest.

Figure 8F:
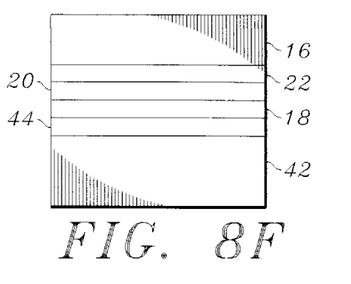

FIG. 8F shows first mirror 16 grown on second contact layer 22. First mirror 16 is typically a quarter wave stack, comprised of alternating layers of aluminum gallium arsenide and oxidized aluminum arsenide, but can be other materials.

Figure 8G:
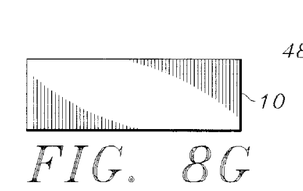

FIG. 8G shows second substrate 10. Second substrate 10 is typically silicon, aluminum oxide, silicon carbide, or gallium arsenide, but can be other materials.

Figure 8H:
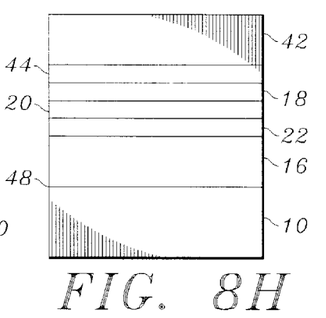

FIG. 8H shows first mirror 16 coupled to second substrate 10. This coupling is typically an epoxy bond.

Figure 8I:
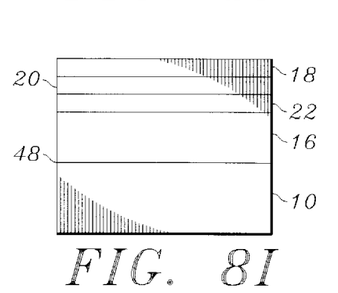

FIG. 8I shows that first contact layer 18 has been exposed by removing second substrate 42 and liftoff layer 44.

Figure 8J:
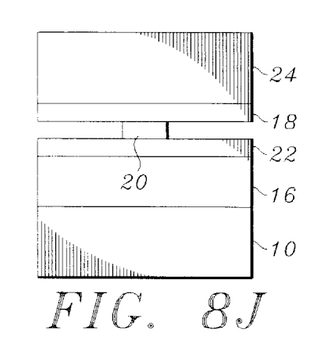

FIG. 8J shows second mirror 24 attached to second contact layer 18. Second mirror 24 is typically a quarter wave stack of alternating layers of titanium oxide and silicon dioxide, but can be comprised of other materials, such as aluminum gallium arsenide/aluminum gallium indium phosphide (AlGaAs/AlGaInP), aluminum gallium arsenide/aluminum oxide (AlGaAs/Al$_2$O$_3$), insulating titanium dioxide/silicon oxide (TiO$_2$/SiO$_2$), magnesium fluoride/zinc sulfide (MgF/ZnS), calcium fluoride/zinc sulfide (CaF/ZnS), conductive indium tin oxide/zinc oxide (ITO/ZnO), or other materials. Further, a metal backing layer can be used on the mirror 16 to reduce the mirror 16 thickness and increase the mirror 16 reflectivity.

Figure 8K:
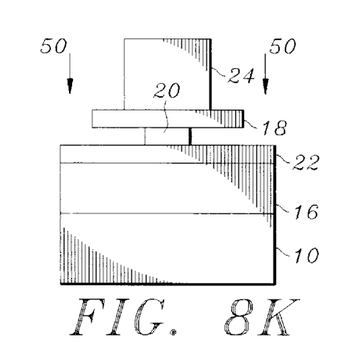

FIG. 8K shows second mirror 24, contact layer 18, active layer 20, and second contact layer 22 etched away by etch process 50. The etch process 50 is typically a selective etch. The etch process 50 is typically photoelectrochemical (PEC) lateral underetching, but can be other methods of etching. The etch process 50 is typically a bandgap selective PEC-etching technique, but can be other etch techniques as desired.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method of making a vertical cavity laser, comprising the step of forming at least one contact within the laser cavity, wherein the contact is positioned between a first mirror and a second mirror of the vertical cavity laser, and an active layer of the vertical cavity laser is a group III nitride film.

2. The method of claim 1, wherein the at least one contact is substantially transparent at a laser output frequency.

3. The method of claim 1, wherein the at least one contact layer is selected from a group comprising n+ doped gallium nitride, conducting indium tin oxide, and alloys of gallium nitride.

4. A method for making a vertical cavity laser, comprising the steps of:
   growing a first mirror on a substrate;
   growing a first contact layer on the first mirror;
   growing an active layer on the first contact layer;
   growing a second contact layer on the active layer;
   growing a second mirror on the second contact layer;
   undercutting the active layer to a first width;
   etching the second mirror to a second width, such that the second width of the second mirror is wider than the first width and coaxial with the first width; and
   etching the second contact layer to a third width, wherein the third width is wider than the second width and is offset from the axis of the first and second widths, and an edge of the second contact layer is flush with an edge of the second mirror.

5. The method of claim 4, wherein the first mirror is a distributed Bragg reflector.

6. The method of claim 4, wherein the second mirror is a distributed Bragg reflector.

7. The method of claim 4, wherein the first mirror is alternating layers of gallium nitride and aluminum nitride.

8. The method of claim 4, wherein the first contact is n+ doped gallium nitride.

9. The method of claim 4, wherein the second contact is p+ doped gallium nitride.

10. The method of claim 4, wherein the substrate is selected from a group comprising sapphire, silicon, silicon carbide, gallium nitride, and $Al_xGa_{1-x}N$.

11. The method of claim 4, wherein the first contact layer is substantially transparent at a laser output frequency.

12. The method of claim 4, wherein the second contact layer is substantially transparent at a laser output frequency.

13. The method of claim 4, further comprising the steps of growing an inhibitor layer on the substrate, etching the inhibitor layer, such that the inhibitor layer contains apertures, the apertures exposing the substrate therein; and growing the first mirror on the substrate within the apertures.

14. The method of claim 13, wherein the inhibitor layer is selected from a group comprising silicon dioxide, silicon nitride, and titanium dioxide.

15. A method for making a vertical cavity laser, comprising the steps of:
   growing a first inhibitor layer on a substrate;
   etching the first inhibitor layer, such that the first inhibitor layer contains apertures, the apertures exposing the substrate therein;
   growing a first mirror on the substrate within the apertures;
   growing a first contact layer on the first mirror;
   growing an active layer on the first contact layer;
   etching the active layer to a first width;
   growing a second growth inhibitor on a first portion of the first contact layer and the proximate portion of the first inhibitor layer, such that the second growth inhibitor is adjacent to at least a portion of the active layer and such that a second portion of the first contact layer remains exposed;
   etching the second portion of the first contact layer to a second width, such that the active layer overhangs at least part of the first contact layer, and whereby a portion of the first mirror is exposed;
   growing a second contact layer on the active layer and the exposed portion of the first mirror;
   growing a third inhibitor layer on the first inhibitor layer and on a portion of the second contact layer, whereby covering the portion of the second contact layer that overlays the first mirror;
   growing a second mirror on a portion of the second contact layer not covered by the third inhibitor layer; and
   etching the second and the third inhibitor layers to expose the first and second contact layers.

16. The method of claim 15, wherein the first inhibitor layer is selected from a group comprising silicon dioxide, silicon nitride, and titanium dioxide.

17. The method of claim 15, wherein the second inhibitor layer is selected from a group comprising silicon dioxide, silicon nitride, and titanium dioxide.

18. The method of claim 15, wherein the third inhibitor layer is selected from a group comprising silicon dioxide, silicon nitride, and titanium dioxide.

19. The method of claim 15, wherein a composition of a second mirror is selected from a group comprising insulating titanium dioxide/silicon oxide, magnesium fluoride/zinc sulfide, calcium fluoride/zinc sulfide, and conductive indium tin oxide/zinc oxide.

20. A method for making a vertical cavity laser, comprising the steps of:
   growing a liftoff layer on a first substrate;
   growing a first contact layer on the liftoff layer;
   growing an active layer on the first contact layer;
   growing a second contact layer on the active layer;
   growing a first mirror on a second substrate;
   growing a third contact layer on the first mirror;
   bonding the second contact layer to the third contact layer;
   removing the first substrate and liftoff layer from the first contact layer, thereby exposing the first contact layer;
   depositing a second mirror on the first contact layer;
   etching the second mirror to a first width; and
   etching the first contact layer, active layer, second contact layer, and third contact layer to a second width, an axis of the second width being offset with an axis of the first width, such that the first width is offset coaxially from the second width.

21. The method of claim 20, where the liftoff layer is selected from a group comprising $In_xGa_yN$, where x is less than 0.2, zinc oxide, lanthanum gallium oxide, silicon, and gallium arsenide.

22. The method of claim 20, where the first substrate is selected from a group comprising sapphire, silicon, gallium nitride, silicon carbide, and $Al_xGa_{1-x}N$.

23. The method of claim 20, where the active layer is indium gallium nitride.

24. The method of claim 20, where the first mirror is alternating layers of aluminum gallium arsenide and oxidized aluminum arsenide.

25. The method of claim 20, where the third contact layer is partially oxidized p+ aluminum gallium arsenide.

26. The method of claim 20, where the step of bonding is done by fusion.

27. The method of claim 20, wherein the step of bonding is performed with an optically transparent material, selected from a group comprising epoxy bonding and optical cementing.

28. A method for making a vertical cavity laser, comprising the steps of:

growing a liftoff layer on a first substrate;

growing a first contact layer on the liftoff layer;

growing an active layer on the first contact layer;

growing a second contact layer on the active layer;

growing a first mirror on the second contact layer;

bonding the first mirror to a second substrate;

removing the first substrate and the liftoff layer from the first contact layer, thereby exposing the first contact layer;

depositing a second mirror on the exposed first contact layer; and etching the second mirror to a first width; and etching the first contact layer, active layer, and second contact layer to a second width, an axis of the second width being offset with an axis of the first width, such that the first width is offset coaxially from the second width.

29. The method of claim 28, wherein the first mirror is selected from a group comprising alternating layers of titanium oxide and silicon oxide, alternating layers of magnesium fluoride and zinc sulfide, alternating layers of calcium fluoride and zinc sulfide, and alternating layers of conductive indium tin oxide and zinc oxide.

30. The method of claim 28, wherein the method further comprises the step of attaching a backing layer to the first mirror for increasing a reflectivity of the first mirror.

31. The method of claim 28, wherein the method further comprises the step of attaching a backing layer to the second mirror for increasing a reflectivity of the second mirror.

32. The method of claim 28, wherein the step of bonding is performed with an optically transparent material, selected from a group comprising epoxy bonding optical cementing, and wafer fusing.

* * * * *

UNITED STATES PATENT AND TRADEMARK OFFICE
CERTIFICATE OF CORRECTION

PATENT NO. : 5,877,038

DATED : March 2, 1999

INVENTOR(S) : Larry A. Coldren and Steven P. DenBaars

It is certified that error appears in the above-identified patent and that said Letters Patent is hereby corrected as shown below:

Column 1, line 3, after the Title, insert:

--Statement Regarding Federally Sponsored Research Or Development

This invention was made with Government support under Grant No. MDA972-94-1-0002, awarded by the AFOSR. The Government has certain rights in this invention.--

Signed and Sealed this

Thirty-first Day of August, 1999

Attest:

Q. TODD DICKINSON

*Attesting Officer*    Acting Commissioner of Patents and Trademarks